United States Patent
Yoon et al.

(10) Patent No.: US 11,322,405 B2
(45) Date of Patent: May 3, 2022

(54) SUBSTRATE DICING METHOD, METHOD OF FABRICATING SEMICONDUCTOR DEVICE, AND SEMICONDUCTOR CHIP FABRICATED BY THEM

(71) Applicant: Samsung Electronics Co., Ltd., Suwon-si (KR)

(72) Inventors: Junho Yoon, Anyang-si (KR); Jungchul Lee, Hwaseong-si (KR); Byungmoon Bae, Daegu (KR); Junggeun Shin, Cheonan-si (KR); Hyunsu Sim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 24 days.

(21) Appl. No.: 16/909,136

(22) Filed: Jun. 23, 2020

(65) Prior Publication Data
US 2021/0159121 A1 May 27, 2021

(30) Foreign Application Priority Data
Nov. 25, 2019 (KR) .................. 10-2019-0151826

(51) Int. Cl.
| | |
|---|---|
| G11B 11/105 | (2006.01) |
| B23K 26/00 | (2014.01) |
| B23K 26/40 | (2014.01) |
| H01L 21/78 | (2006.01) |
| H01L 21/268 | (2006.01) |
| H01L 21/683 | (2006.01) |
| H01L 21/304 | (2006.01) |

(52) U.S. Cl.
CPC ............ *H01L 21/78* (2013.01); *H01L 21/268* (2013.01); *H01L 21/304* (2013.01); *H01L 21/6836* (2013.01); *H01L 2221/68336* (2013.01)

(58) Field of Classification Search
CPC .......... H01L 21/3043; H01L 21/30625; H01L 2221/68336; H01L 21/78
See application file for complete search history.

(56) References Cited

U.S. PATENT DOCUMENTS

| | | | |
|---|---|---|---|
| 8,617,964 B2 | 12/2013 | Sakamoto et al. | |
| 8,755,107 B2 | 6/2014 | Sakamoto et al. | |
| 2007/0155131 A1* | 7/2007 | Contes | H01L 21/78 438/458 |

(Continued)

FOREIGN PATENT DOCUMENTS

| | | |
|---|---|---|
| JP | 2009259860 A | 11/2009 |
| JP | 4692717 B2 | 6/2011 |

(Continued)

*Primary Examiner* — Brian Turner
(74) *Attorney, Agent, or Firm* — Harness, Dickey & Pierce, P.L.C.

(57) ABSTRACT

According to an embodiment of inventive concepts, a substrate dicing method may include forming reformed patterns in a substrate using a laser beam, grinding a bottom surface of the substrate to thin the substrate, and expanding the substrate to divide the substrate into a plurality of semiconductor chips. The forming of the reformed patterns may include forming a first reformed pattern in the substrate and providing an edge focused beam to a region crossing the first reformed pattern to form a second reformed pattern in contact with the first reformed pattern.

20 Claims, 11 Drawing Sheets

(56) References Cited

U.S. PATENT DOCUMENTS

| | | | |
|---|---|---|---|
| 2012/0223061 A1* | 9/2012 | Atsumi | B23K 26/53 219/121.72 |
| 2012/0286429 A1* | 11/2012 | Han | H01L 24/94 257/774 |
| 2017/0157700 A1 | 6/2017 | Bohme et al. | |
| 2017/0165787 A1 | 6/2017 | Jan et al. | |
| 2017/0189991 A1 | 7/2017 | Gollier et al. | |
| 2020/0302965 A1* | 9/2020 | Wang | G01R 33/0325 |

FOREIGN PATENT DOCUMENTS

| | | | | |
|---|---|---|---|---|
| JP | 2017/521877 A | 8/2017 | | |
| KR | 2016/0041871 A | 4/2016 | | |
| KR | 101655428 B1 | 9/2016 | | |
| KR | 101774290 B1 | 9/2017 | | |
| WO | WO-2018011618 A1 * | 1/2018 | | B23K 26/0676 |

* cited by examiner

SUBSTRATE DICING METHOD, METHOD OF FABRICATING SEMICONDUCTOR DEVICE, AND SEMICONDUCTOR CHIP FABRICATED BY THEM

CROSS-REFERENCE TO RELATED APPLICATIONS

This U.S. non-provisional patent application claims priority under 35 U.S.C. § 119 to Korean Patent Application No. 10-2019-0151826, filed on Nov. 25, 2019, in the Korean Intellectual Property Office, the entire contents of which are hereby incorporated by reference.

BACKGROUND

The present disclosure relates to a method of fabricating a semiconductor device, and in particular, to a substrate dicing method, a method of fabricating a semiconductor device using the same, and/or a semiconductor chip fabricated by these methods.

In general, a semiconductor fabrication process includes a front-end process and a back-end process, which are called a wafer-level process and an assembly process, respectively. A substrate dicing process is performed to separate a substrate into semiconductor chips or dies, between the front-and back-end processes. For example, the substrate is diced along a scribe lane by using a dicing saw or a laser beam. In this case, the substrate is divided into the semiconductor chips or the dies which are separated from each other.

SUMMARY

An embodiment of inventive concepts provides a substrate dicing method capable of limiting and/or preventing a dicing crack failure and/or a method of fabricating a semiconductor device using the substrate dicing method.

According to an embodiment of inventive concepts, a substrate dicing method may include forming reformed patterns in a substrate using a laser beam, grinding a bottom surface of the substrate to thin the substrate, and expanding the substrate to divide the substrate into a plurality of dies. The forming the reformed patterns may include forming a first reformed pattern in the substrate and providing an edge focused beam to a region crossing the first reformed pattern to form a second reformed pattern in contact with the first reformed pattern.

According to an embodiment of inventive concepts, a substrate dicing method may include forming reformed patterns in a substrate using a laser apparatus and expanding the substrate to divide the substrate into semiconductor chips. The laser apparatus may include a light source, an objective lens, a first axicon lens, and a second axicon lens. The light source may be configured to generate a laser beam. The objective lens may be between the light source and the substrate. The first and second axicon lenses may be between the objective lens and the light source. The first and second axicon lenses may be configured to generate an edge focused beam from the laser beam. The first and second axicon lenses may include first and second inclined surfaces, respectively, which are inclined at an inclination angle of 51.3° with respect to an optic axis of the laser beam.

According to an embodiment of inventive concepts, a method of fabricating a semiconductor device may include forming a thin film on a substrate and dicing the substrate to divide the substrate into a plurality of semiconductor chips. The dicing the substrate may include forming reformed patterns in a substrate using a laser beam, grinding a bottom surface of the substrate to thin the substrate, and expanding the substrate to divide the substrate into the plurality of semiconductor chips. The forming the reformed patterns may include forming a first reformed pattern in the substrate and providing an edge focused beam to a region crossing the first reformed pattern to form a second reformed pattern in contact with the first reformed pattern.

According to an embodiment of inventive concepts, a semiconductor chip may include a substrate and a thin film on the substrate. The substrate may have a first side surface, a second side surface, and a corner between the first and second side surfaces. The substrate may include a first reformed pattern on the first side surface and a second reformed pattern on the second side surface. The first reformed pattern and the second reformed pattern may be in contact with each other at the corner.

DETAILED DESCRIPTION

Figure 1:
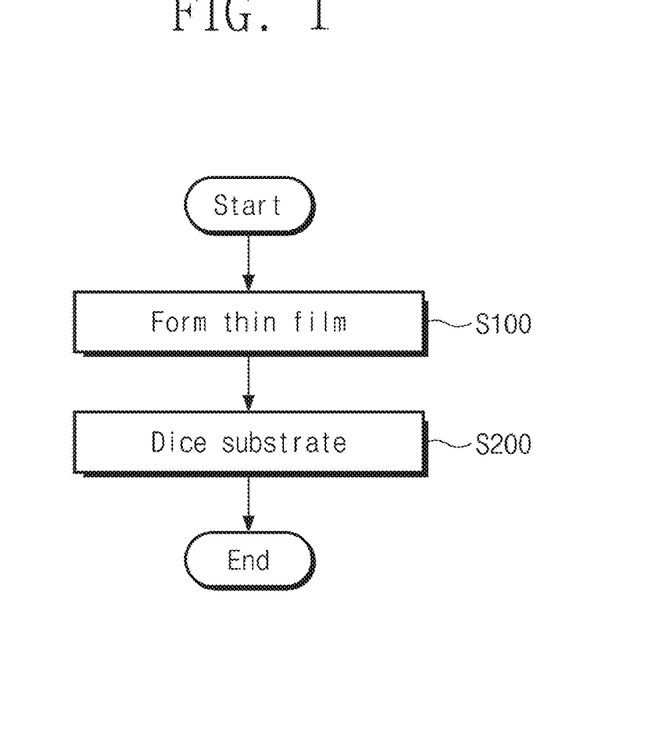
FIG. 1 is a flow chart illustrating a method of fabricating a semiconductor device, according to an embodiment of inventive concepts.
Figure 2:
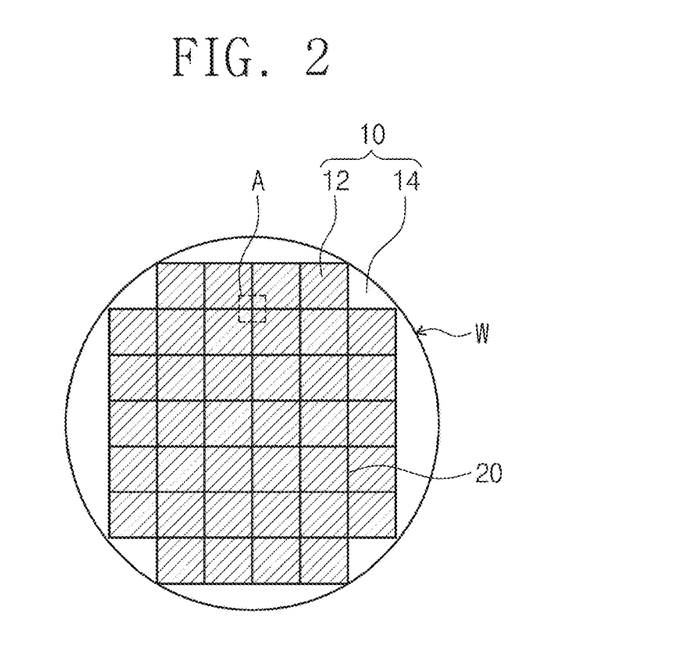
FIG. 2 is a plan view illustrating an example of a thin film formed on a substrate.

FIG. 1 illustrates a method of fabricating a semiconductor device, according to an embodiment of inventive concepts. FIG. 2 illustrates a thin film 10 formed on a substrate W.

Referring to FIGS. 1 and 2, a manufacturing process system may be configured to form the thin film 10 on the substrate W (in S100). The manufacturing process system may include a thin film deposition apparatus, a photolithography apparatus, an etching apparatus, and a cleaning apparatus, but inventive concepts is not limited to these examples. The substrate W may include a single crystalline silicon wafer. The thin film 10 may be formed on a top surface of the substrate W. In an embodiment, the thin film 10 may include active regions 12 and non-active regions 14.

Most of the active regions 12 may be disposed near a center region of the substrate W. For example, each of the active regions 12 may have a rectangular shape. Each of the active regions 12 may be a device region or a chip region. Semiconductor devices may be formed in the active regions 12. The semiconductor device may include volatile memory devices (e.g., DRAM devices), nonvolatile memory devices (e.g., 3D NAND Flash memory devices), or logic devices, but inventive concepts is not limited to this example. Each of the active regions 12 may be defined by a scribe lane 20. For example, the scribe lane 20 may be provided to enclose each of the active regions 12.

The non-active regions 14 may be disposed in an edge region of the substrate W. The non-active regions 14 may be disposed outside the active regions 12 to enclose the active regions 12. For example, each of the non-active regions 14 may have a fan or sector shape. Each of the non-active regions 14 may be a non-device region.

Figure 8:
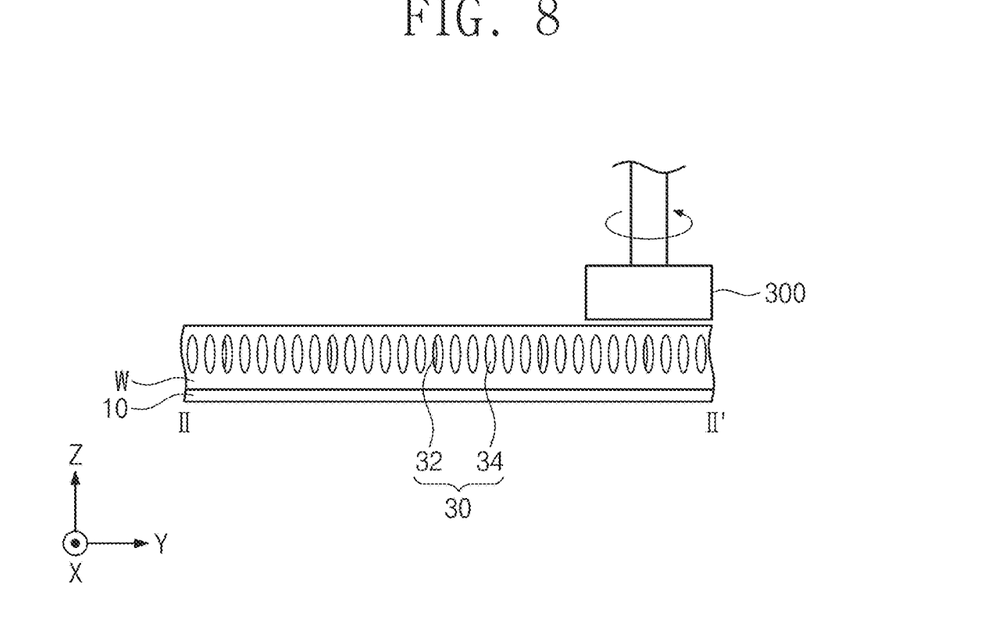
Figure 9:
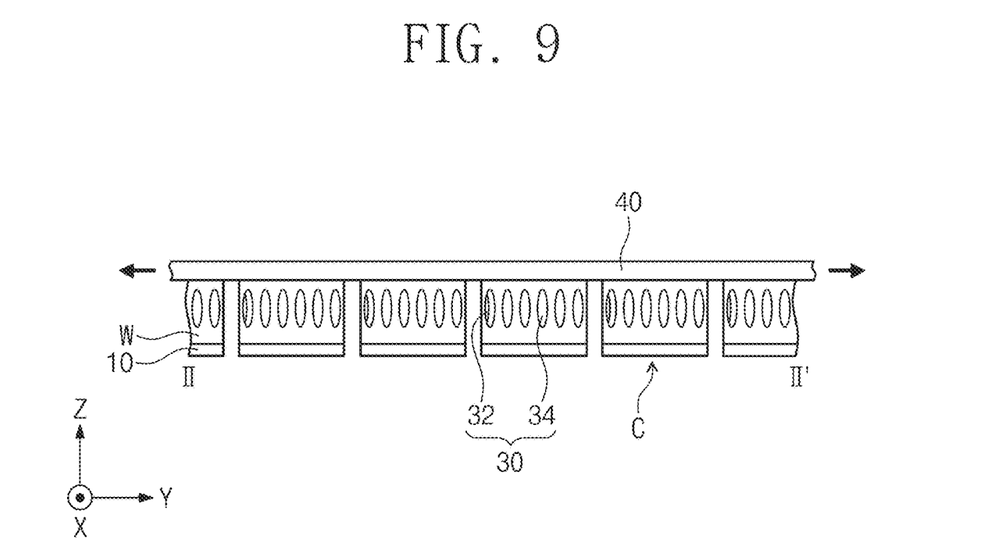

Referring to FIG. 1, a dicing apparatus may be used to cut the substrate W into semiconductor chips C of FIG. 9 (in S200). The dicing apparatus may include a sawing apparatus, a first laser apparatus 100 of FIG. 6, a second laser apparatus 200 of FIG. 7, a polishing apparatus 300 of FIG. 8, and an expander, but inventive concepts is not limited to this example. The substrate W may be diced or cut along the scribe lane 20. For example, the substrate W may be diced or cut by a grinding-after-laser-beam-exposure (GAL) process. The substrate W may have a thickness of about 0.775 mm, but is not limited thereto. The thickness of the substrate W may be increased in proportion to a thickness of a pattern that is formed on the substrate W.

Figure 3:
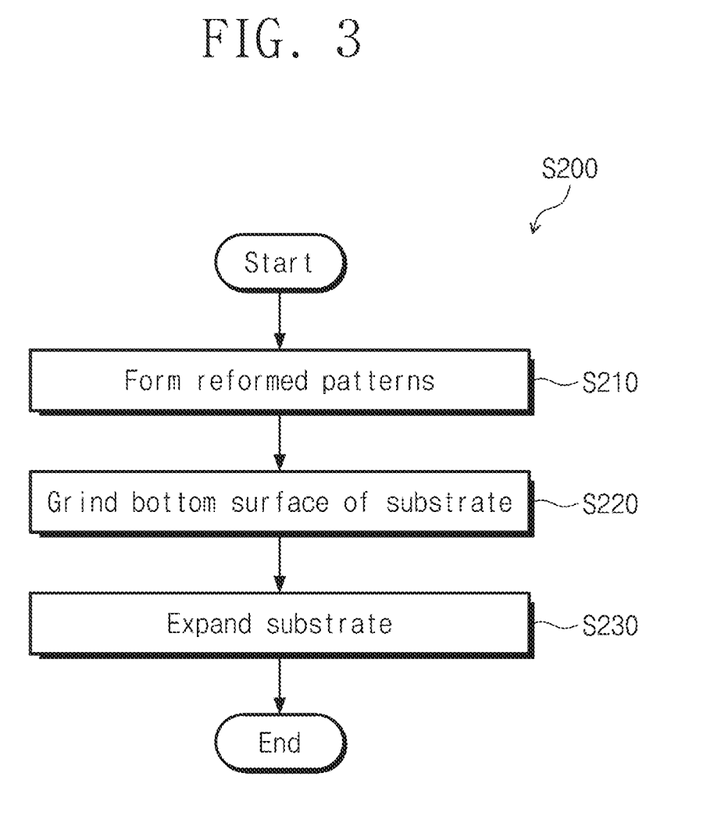
FIG. 3 is a flow chart illustrating an example operation of dicing the substrate of FIG. 2 to divide semiconductor chips spaced apart from each other.
Figure 4:
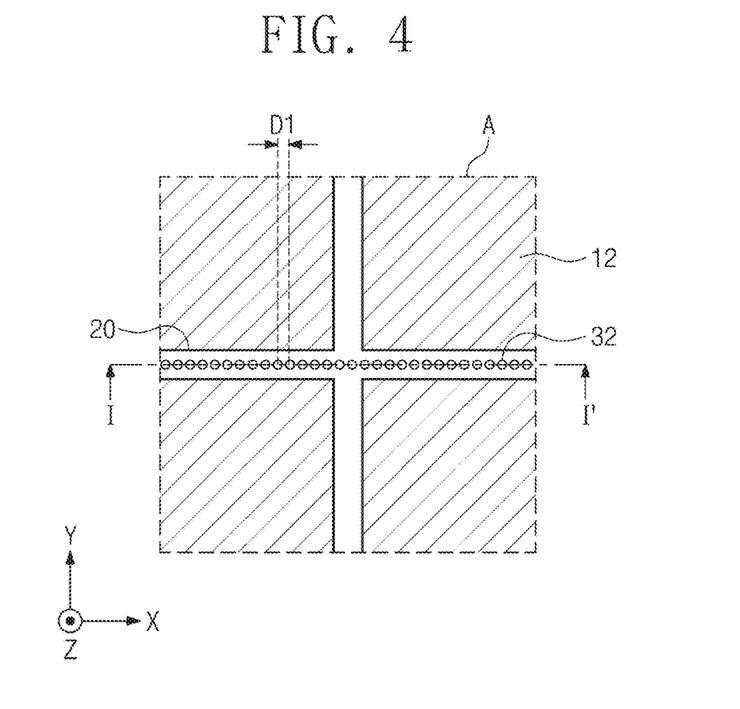
FIGS. 4 and 5 are enlarged plan views, each of which illustrates a portion A of FIG. 2.
Figure 5:
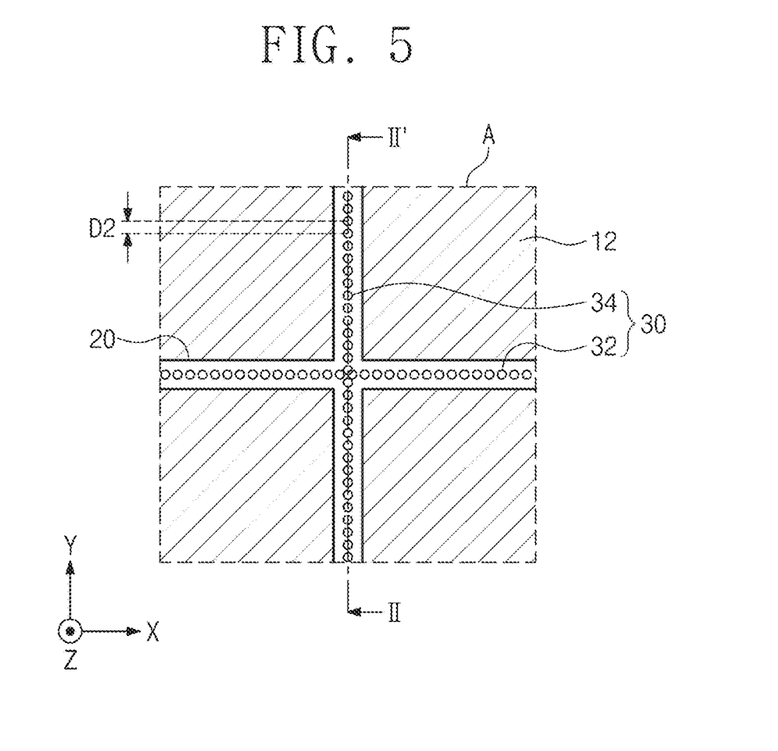
Figure 6:
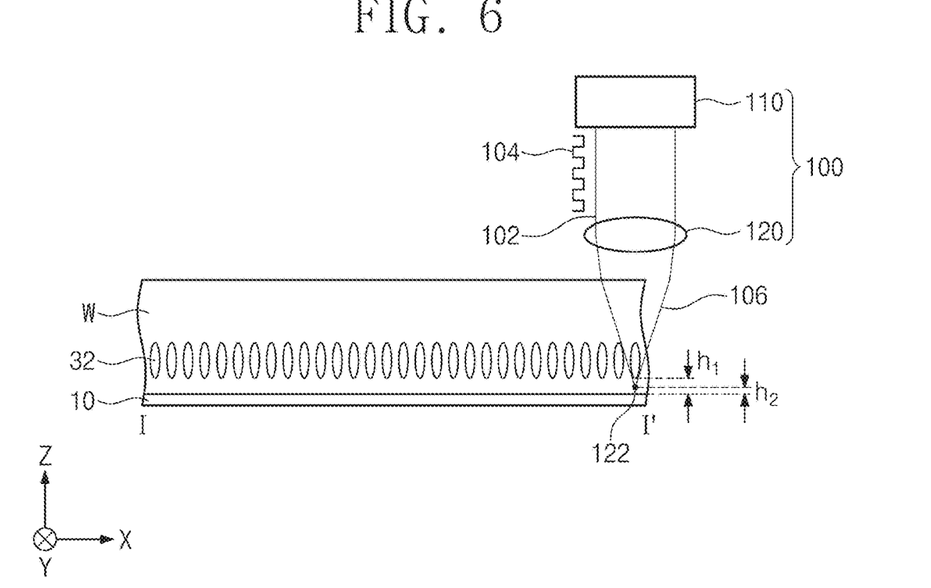
FIG. 6 is a sectional view taken along line I-I' of FIG. 4.
Figure 7:
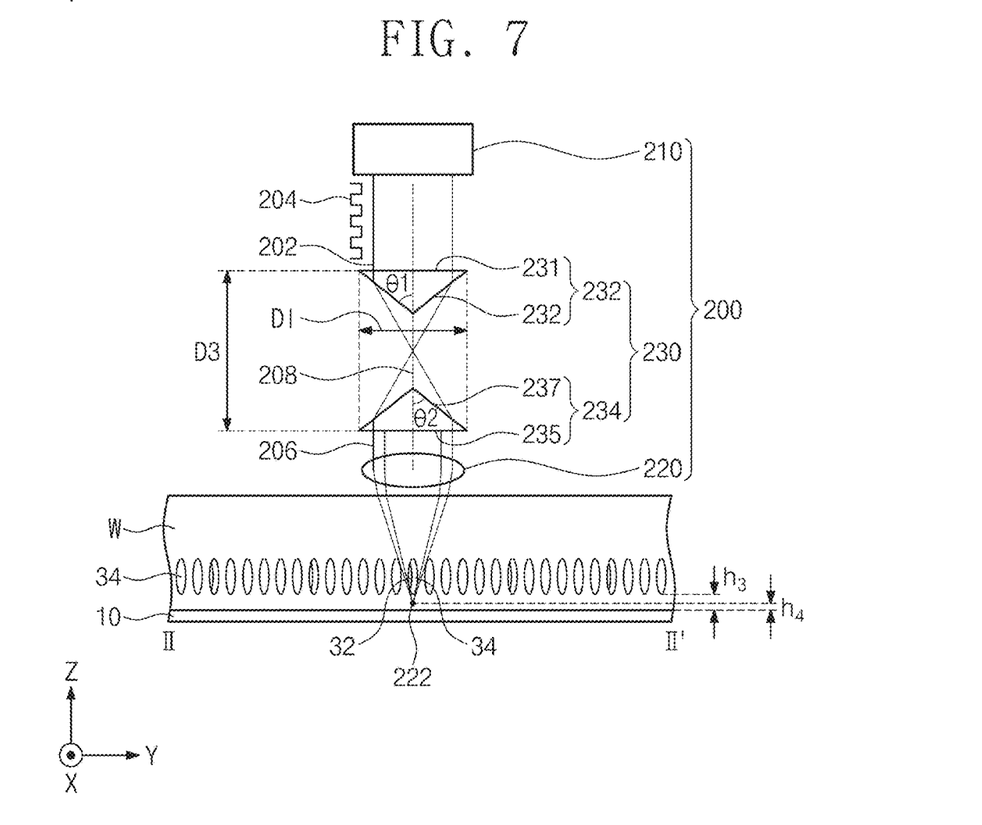
FIGS. 7 to 9 include sectional views taken along line II-IT of FIG. 5.

FIG. 3 illustrates an example of an operation S200 of dicing the substrate W of FIG. 2 to divide the semiconductor chips C, which are spaced apart from each other. FIGS. 4 and 5 are enlarged plan views, each of which illustrates a portion A of FIG. 2. FIG. 6 is a sectional view taken along line I-I' of FIG. 4. FIGS. 7 to 9 include sectional views taken along line II-II' of FIG. 5.

Referring to FIGS. 3 to 9, the first laser apparatus 100 and the second laser apparatus 200 may form reformed patterns 30 in the scribe lane 20 of the substrate W, using a first laser beam 102 and a second laser beam 202 (in S210). The reformed patterns 30 may be formed regularly (e.g., with a constant distance) in the scribe lane 20 of the substrate W. For example, the reformed patterns 30 may be formed to be uniformly spaced apart from each other by a first center-to-center distance D1 in a first direction X and to be uniformly spaced apart from each other by a second center-to-center distance D2 in a second direction Y. The first center-to-center distance D1 may be equal to the second center-to-center distance D2. For example, each of the first and second center-to-center distances D1 and D2 may range from about 6 µm to about 10 µm. When viewed in a plan view, the reformed patterns 30 may be spaced apart from each other by a distance of about 2 µm or shorter or may be in contact with each other. Each of the reformed patterns 30 may have an elliptical sphere shape that is elongated in a third direction Z. Each of the reformed patterns 30 may have a width WD (e.g., see FIG. 16) of about 1.5 µm to about 5 µm and a thickness T (e.g., see FIG. 16) of about 20 µm.

The reformed patterns 30 may have material characteristics different from the substrate W. For example, when the substrate W is formed of single crystalline silicon, each of the reformed patterns 30 may include amorphous or polycrystalline silicon. In an embodiment, the reformed patterns 30 may include first reformed patterns 32 and second reformed patterns 34. For example, the first reformed pattern 32 may be formed to be arranged in the first direction X. The second reformed patterns 34 may be formed to be arranged in the second direction Y.

Figure 10:
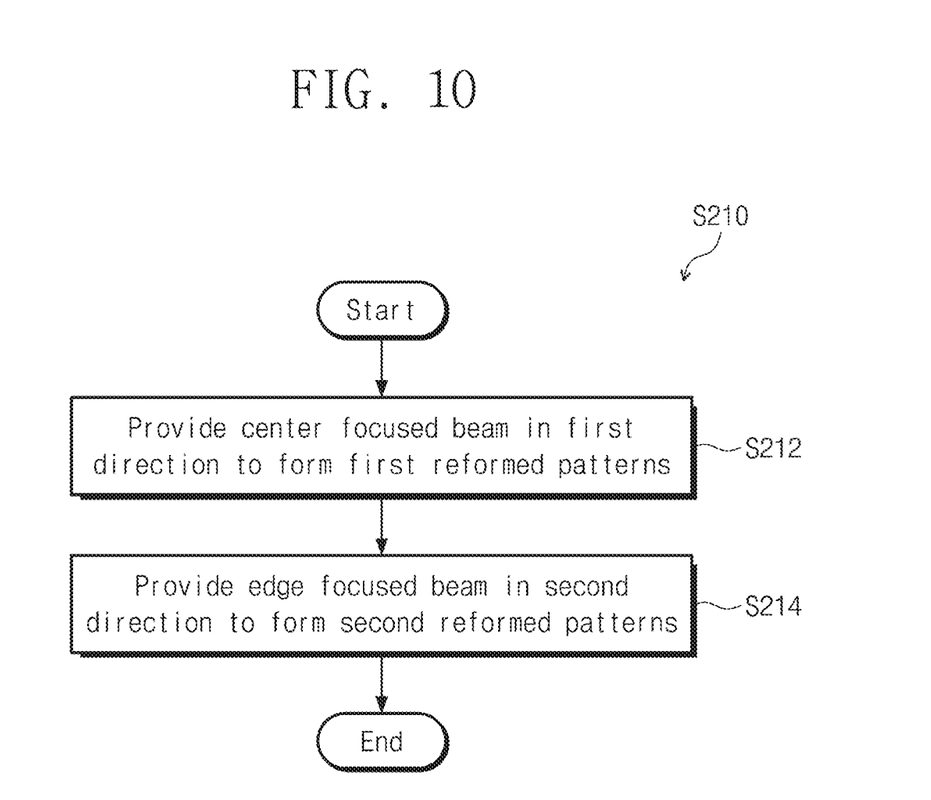
FIG. 10 is a flow chart illustrating an example operation of forming reformed patterns in the substrate of FIG. 2.

FIG. 10 illustrates an example of the operation S210 of forming the reformed patterns 30 in the substrate W of FIG. 2.

Referring to FIGS. 4, 6, and 10, the first laser apparatus 100 may provide a center focused beam 106 to a lower portion of the substrate W along the first direction X, and as a result, the first reformed patterns 32 may be formed in the substrate W (in S212). The first laser apparatus 100 may generate the center focused beam 106 using the first laser beam 102. In an embodiment, the first laser apparatus 100 may include a first light source 110 and a first objective lens 120.

The first light source 110 may generate the first laser beam 102 and may provide the first laser beam 102 to the first objective lens 120. For example, the first light source 110 may include a laser diode. The first laser beam 102 may have a power and/or energy ranging from about 0.5 W to about 2.5 W. The first laser beam 102 may be provided in the form of a first pulse 104. For example, the first pulse 104 may have a pulse frequency of about 100 kHz. The first laser beam 102 may pass through the substrate W. In an embodiment, the first laser beam 102 may have, for example, a first wavelength of about 1100 nm.

The first objective lens 120 may be disposed between the first light source 110 and the substrate W. The first objective lens 120 may include, for example, a convex lens. The first objective lens 120 may have a numerical aperture (NA) of about 0.8. The first objective lens 120 may convert the first laser beam 102 to the center focused beam 106. The first laser beam 102 may be a collimated beam, and the center focused beam 106 may be focused on a first focal point 122. The center focused beam 106 may pass through the substrate W. The center focused beam 106 may pass through a bottom surface of the substrate W and may be focused on the first focal point 122. The center focused beam 106 may be used to form the first reformed pattern 32 near the first focal point 122, which is located in the substrate W. The first reformed pattern 32 may be formed in a portion of the substrate W located between the first objective lens 120 and the first focal point 122. For example, the first reformed pattern 32 may be formed to be spaced apart from the thin film 10 by a first height h1 of about 5 µm to about 10 µm. The first focal point 122 may be disposed between the first reformed pattern 32 and the thin film 10. The first focal point 122 may be adjusted to be located at a second height h2 of about 2 µm to about 3 µm from the thin film 10.

Figure 11:
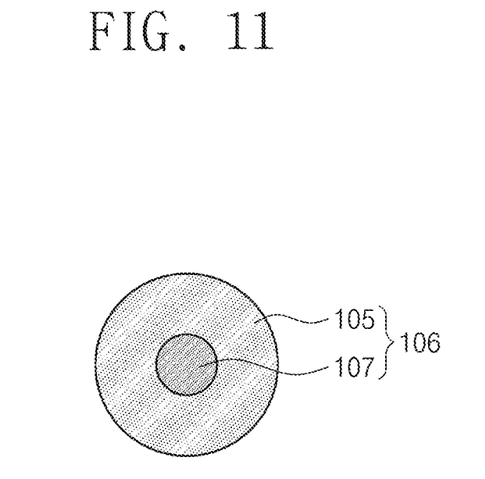
FIG. 11 is a diagram illustrating an example of a center focused beam of FIG. 6.

FIG. 11 illustrates an example of the center focused beam 106 of FIG. 6.

Referring to FIGS. 6 and 11, the center focused beam 106 may have an inward increasing energy. In an embodiment, the center focused beam 106 may have a first energy fraction 105 and a second energy fraction 107.

The first energy fraction 105 may be provided around the second energy fraction 107. The first energy fraction 105 may have a ring-shaped section. The first energy fraction 105 may have an energy density that is lower than an energy density of the second energy fraction 107. The first energy fraction 105 of the center focused beam 106 may be provided to an edge portion of the first reformed pattern 32.

The second energy fraction 107 may be within the first energy fraction 105. The second energy fraction 107 may have a circular section. A diameter of the second energy fraction 107 may be smaller than a diameter of the first energy fraction 105. The second energy fraction 107 may have an energy density that is higher than that of the first energy fraction 105. The second energy fraction 107 of the center focused beam 106 may be provided to a center portion of the first reformed pattern 32. The second energy fraction 107 of the center focused beam 106 may be provided into the substrate W in the third direction Z perpendicular to the substrate W.

The first and second energy fractions 105 and 107 of the center focused beam 106 may heat the substrate W at the first focal point 122 to form the first reformed pattern 32 in a portion of the substrate W located on the first focal point 122.

Referring back to FIGS. 4 and 6, the first reformed patterns 32 may be formed to be arranged in the first direction X. The first reformed patterns 32 may be uniformly spaced apart from each other by the first center-to-center distance D1 of about 6 μm to about 10 μm. The first reformed patterns 32 may be spaced apart from each other by a distance of about 2 μm or may be in contact with each other.

Referring to FIGS. 5, 7, and 10, the second laser apparatus 200 may provide an edge focused beam 206 to a lower portion of the substrate W along the second direction Y, and as a result, the second reformed patterns 34 may be formed in the substrate W (in S214). The second laser apparatus 200 may produce the edge focused beam 206 from the second laser beam 202. In an embodiment, the second laser apparatus 200 may include a second light source 210, a plurality of axicon lenses 230, and a second objective lens 220.

The second light source 210 may generate the second laser beam 202. The second light source 210 may include, for example, a laser diode. The second laser beam 202 may be the same as the first laser beam 102. The second laser beam 202 may have a power ranging from about 0.5 W to about 2.5 W and/or a corresponding energy. The second laser beam 202 may be a collimated beam. The second laser beam 202 may be provided in the form of a second pulse 204. The second pulse 204 may have a pulse frequency of about 100 KHz. The second laser beam 202 may pass through the substrate W. The second laser beam 202 may have a wavelength of about 1100 nm.

The axicon lenses 230 may be disposed between the second light source 210 and the second objective lens 220. The axicon lenses 230 may produce the edge focused beam 206 from the second laser beam 202. In an embodiment, the axicon lenses 230 may include a first axicon lens 232 and a second axicon lens 234. The first axicon lens 232 and the second axicon lens 234 may be disposed to face each other. Alternatively, the first axicon lens 232 and the second axicon lens 234 may be disposed to be opposite to each other.

The first axicon lens 232 may be disposed between the second light source 210 and the second axicon lens 234. The first axicon lens 232 may be transparent to the second laser beam 202, and thus, the second laser beam 202 may be provided to the second axicon lens 234 through the first axicon lens 232. In an embodiment, the first axicon lens 232 may have a first flat surface 231 and a first inclined surface 233. The first flat surface 231 may be perpendicular to an optic axis 208 of the second laser beam 202. The first flat surface 231 may have a diameter DI of about 14 mm. The first inclined surface 233 may be disposed between the first flat surface 231 and the second axicon lens 234. The first inclined surface 233 may have a first inclination angle θ1 with respect to the optic axis 208 of the second laser beam 202. The first inclined surface 233 may be configured to refract the second laser beam 202 to the second axicon lens 234.

The second axicon lens 234 may be disposed between the first axicon lens 232 and the second objective lens 220. The second axicon lens 234 may be disposed between a focal point of the first axicon lens 232 and the second objective lens 220. The second axicon lens 234 may be placed beyond the focal point of the first axicon lens 232. The second laser beam 202 passing through the second axicon lens 234 may be used as the edge focused beam 206. The second axicon lens 234 may have a second flat surface 235 and a second inclined surface 237. The second flat surface 235 may be perpendicular to the optic axis 208 of the second laser beam 202. The second flat surface 235 may be parallel to the first flat surface 231 and have a diameter DI same as a diameter of the first flat surface 231. The second flat surface 235 may have the diameter DI of about 14 mm. The second inclined surface 237 may have a second inclination angle θ2 with respect to the optic axis 208 of the second laser beam 202. The second inclination angle θ2 may be equal to the first inclination angle θ1. For example, the first flat surface 231 may be spaced apart from the second flat surface 235 by a third distance D3 of about 15 mm.

Figure 12:
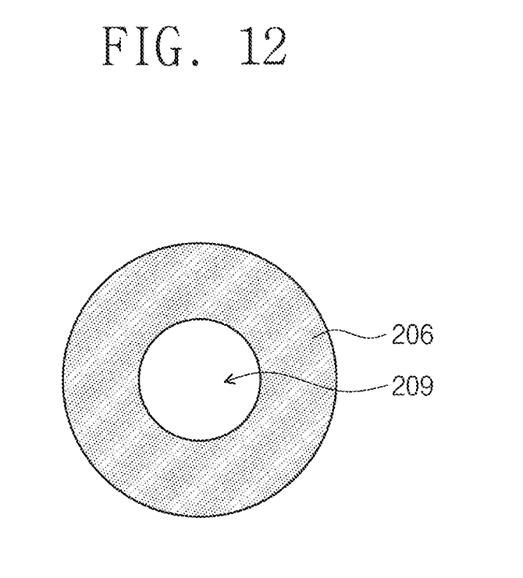
FIG. 12 is a diagram illustrating an example of an edge focused beam of FIG. 7.

FIG. 12 illustrates an example of the edge focused beam 206 of FIG. 7.

Referring to FIG. 12, the edge focused beam 206 may have a ring shape. An empty region 209 having a negligible light energy may be formed in the edge focused beam 206. The sizes or areas of the edge focused beam 206 and the empty region 209 may be changed depending on the first inclination angle θ1 and/or the second inclination angle θ2.

Referring back to FIG. 7, the second objective lens 220 may be disposed between the second axicon lens 234 and the substrate W. The second objective lens 220 may be configured to have substantially the same features as the first objective lens 120. The second objective lens 220 may have a numerical aperture (NA) of about 0.8. The second objective lens 220 may be used to provide the edge focused beam 206 to the bottom surface of the substrate W. The second objective lens 220 may focus the edge focused beam 206 in the substrate W. The second objective lens 220 may have a second focal point 222. The edge focused beam 206 may heat the substrate W at the second focal point 222 to form the second reformed pattern 34 on the second focal point 222.

Referring to FIGS. 5 and 7, the second reformed pattern 34 may be formed between the second objective lens 220 and the second focal point 222. The second reformed pattern 34 may be formed to be spaced apart from the thin film 10 by a third height h3 of about 5 μm to about 10 μm. The second focal point 222 may be adjusted to a position that is spaced apart from the thin film 10 by a fourth height h4 of about 2 μm to about 3 μm. When viewed in a plan view, the first and second reformed patterns 32 and 34 may be in contact with each other at a position adjacent to the corner of the active region 12.

In an embodiment, the edge focused beam 206 may be provided to a region around the first reformed pattern 32 to form the second reformed pattern 34 in contact with the first reformed pattern 32. If the first inclination angle θ1 of the first axicon lens 232 and the second inclination angle θ2 of the second axicon lens 234 are adjusted, the edge focused beam 206 may be irradiated to a region outside the first reformed pattern 32 and may be provided to the second focal point 222. The second focal point 222 may be located below the first reformed pattern 32.

Figure 13:
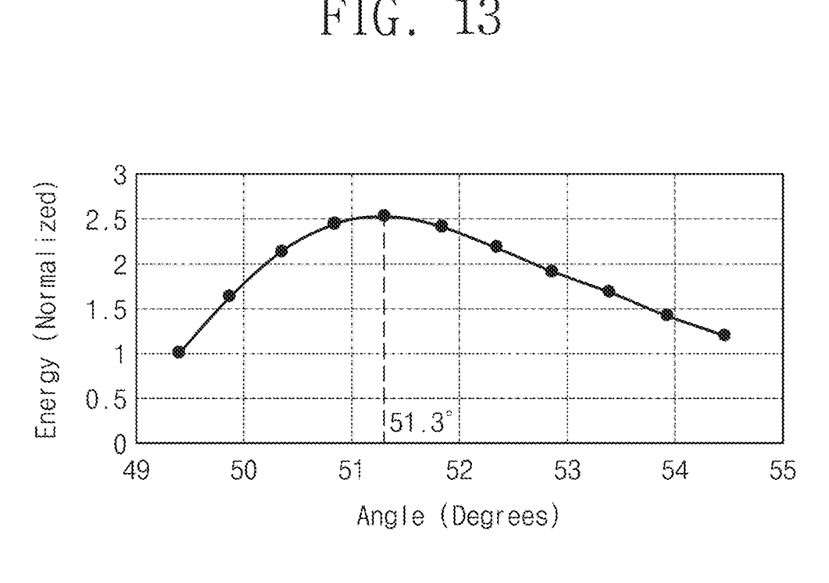
FIG. 13 is a graph showing an energy of an edge focused beam provided to a second focal point versus first and second inclination angles of FIG. 7.

FIG. 13 shows an energy of the edge focused beam 206 provided to the second focal point 222 versus the first and second inclination angles θ1 and θ2 of FIG. 7.

Referring to FIG. 13, an energy of the edge focused beam 206 provided to the second focal point 222 may be changed depending on the first inclination angle θ1 and the second inclination angle θ2. For example, in the case where the first and second inclination angles θ1 and θ2 are about 51.3°, the edge focused beam 206 may have the highest energy. In other words, when the axicon lenses 230 are provided to have the first and second inclination angles θ1 and θ2 of about 51.3°, it may be possible to efficiently form the second reformed pattern 34, which is in contact with the first reformed pattern 32.

Referring back to FIG. 5, the second reformed patterns 34 may be formed to be spaced apart from each other by a constant distance (e.g., the second center-to-center distance D2). In an embodiment, the second center-to-center distance D2 may range from about 6 µm to about 10 µm. The second reformed patterns 34 may be spaced apart from each other by a distance of about 2 µm or may be in contact with each other.

By contrast, the second reformed pattern 34, which is in contact with the first reformed pattern 32, may not be formed by the first laser apparatus 100. The second reformed pattern 34 may not be formed regularly with the second center-to-center distance D2. If the center focused beam 106 is provided to the second focal point 222, the second energy fraction 107 of the center focused beam 106 may be absorbed by the first reformed pattern 32, and thus, the second reformed pattern 34 may not be formed in a desired manner. That is, it may be difficult to form the second reformed pattern 34, which is in contact with the first reformed pattern 32.

Figure 14:
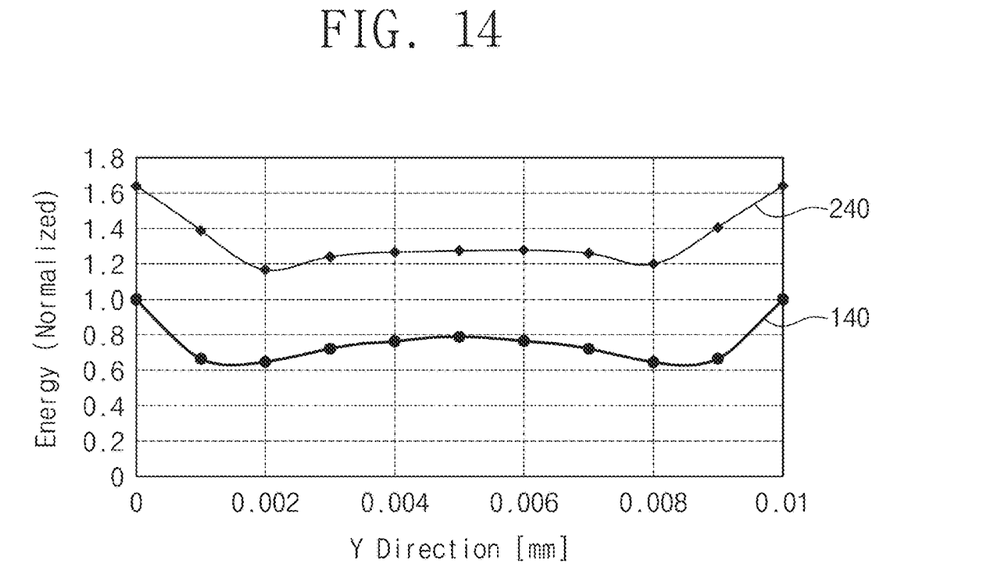
FIG. 14 is a graph showing a first power of a center focused beam and a second power of an edge focused beam, which are provided to a second focal point of FIG. 7.

FIG. 14 illustrates a first energy 140 of the center focused beam 106 and a second energy 240 of the edge focused beam 206 provided to the second focal point 222 of FIG. 7. The horizontal axis represents a moving distance of the second focal point 222 in the second direction Y, and the vertical axis represents a normalized energy.

Referring to FIG. 14, the second energy 240 of the edge focused beam 206 provided onto the second focal point 222 may be higher than the first energy 140 of the center focused beam 106. For example, the second energy 240 may be higher than the first energy 140 by about 40% or higher. The first energy 140 may correspond to the first energy fraction 105 of the second energy fraction 107 of the center focused beam 106. The second energy fraction 107 of the center focused beam 106 may be absorbed by the first reformed pattern 32 and may be lost. The edge focused beam 206 may be provided to the second focal point 222, without the absorption loss by the first reformed pattern 32. Thus, the edge focused beam 206 may heat the substrate W at the second focal point 222 and may form the second reformed pattern 34 on the second focal point 222. The second reformed pattern 34 may be in contact with the first reformed pattern 32.

Figure 15:
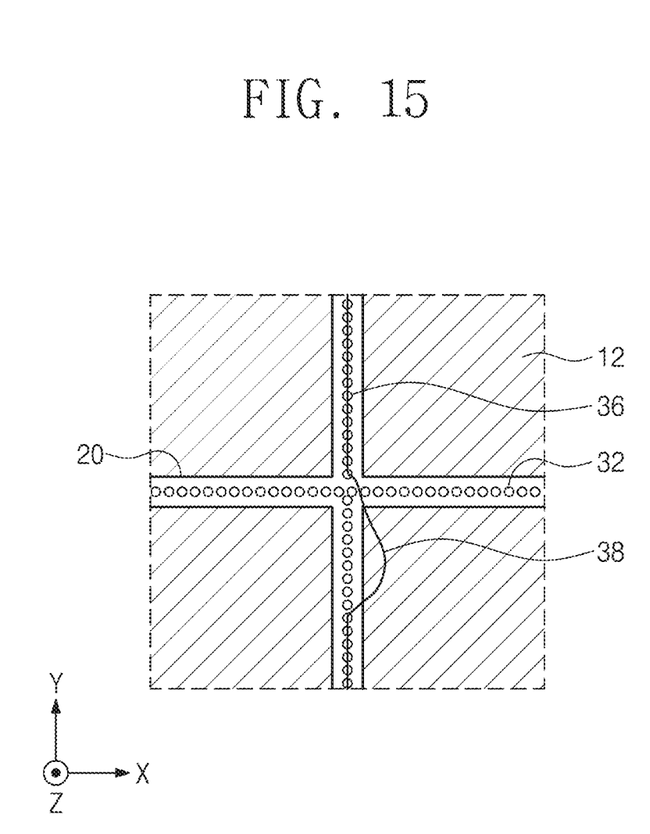
FIG. 15 is a plan view illustrating a typical reformed pattern formed by a center focused beam of FIG. 6.

FIG. 15 illustrates typical reformed patterns 36 formed by the center focused beam 106 of FIG. 6.

Referring to FIG. 15, the typical reformed patterns 36 formed by the center focused beam 106 may not be in contact with the first reformed patterns 32. The typical reformed patterns 36 may be formed with an irregular distance, without any contact with the first reformed patterns 32. Due to the irregular distance between the typical reformed patterns 36, the typical reformed patterns 36 may result in a dicing crack failure 38, when the substrate W is expanded. Furthermore, the dicing crack failure 38 may cause the damage of the active region 12.

Referring back to FIG. 7, the edge focused beam 206 may be used to form the second reformed pattern 34, without interference with the first reformed pattern 32. The edge focused beam 206 may be used to regularly form the second reformed pattern 34 in a corner of the active region 12, and in this case, it may be possible to limit and/or prevent the dicing crack failure 38.

Referring to FIGS. 3 and 8, the polishing apparatus 300 may be configured to grind the bottom surface of the substrate W and to thin the substrate W (in S220). The polishing apparatus 300 may include a grinder or a chemical mechanical polishing apparatus. The thinned substrate W may have a thickness ranging about 50 µm to about 250 µm.

Referring to FIGS. 3 and 9, the expander may expand the substrate W to separate the semiconductor chips C from each other (in S230). The expander may expand the substrate W using a tape film 40. The tape film 40 may be adhered to the bottom surface of the substrate W. The expander may expand the tape film 40 in the first direction X and the second direction Y to separate the semiconductor chips C from each other. The semiconductor chips C may be divided along the first reformed pattern 32 and the second reformed pattern 34 in the scribe lane 20. Thereafter, the semiconductor chip C may be separated from the tape film 40 using a picker.

Figure 16:
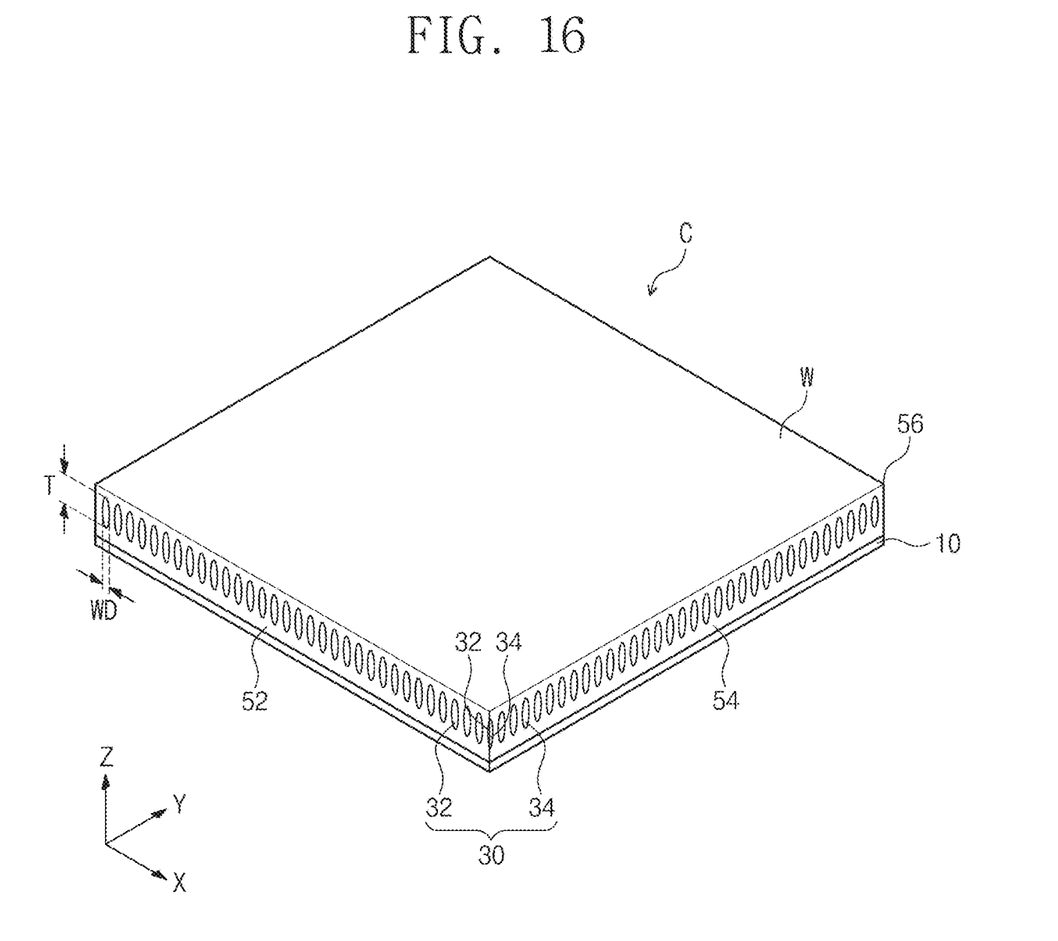
FIG. 16 is a perspective view illustrating an example of a semiconductor chip of FIG. 9.

FIG. 16 illustrates an example of the semiconductor chip C of FIG. 9.

Referring to FIG. 16, the semiconductor chip C may have a rectangular box shape. In an embodiment, the semiconductor chip C may include the substrate W and the thin film 10.

The substrate W may be formed of or include single crystalline silicon. The substrate W may have first and second side surfaces 52 and 54 between its top and bottom surfaces and a corner 56. The first side surface 52 may be parallel to the first direction X. The second side surface 54 may be parallel to a direction crossing the first side surface 52. For example, the second side surface 54 may be parallel to the second direction Y. The corner 56 may be located between the first side surface 52 and the second side surface 54 and may be parallel to the third direction Z. The corner 56 may be an intersection line of the first and second side surfaces 52 and 54. As an example, the substrate W may have the reformed patterns 30. The reformed patterns 30 may be placed in the substrate W. The reformed patterns 30 may have an elliptical sphere shape that is elongated in the third direction Z. The reformed patterns 30 may have a thickness T of about 20 µm and a width WD of about 1.5 µm to 5 µm. In an embodiment, the reformed patterns 30 may include the first reformed pattern 32 and the second reformed pattern 34.

The first reformed patterns 32 may be formed in the first side surface 52, which is parallel to the first direction X, and in the corner 56. The first reformed patterns 32 may be spaced apart from each other by a distance of about 2 µm or shorter in the first direction X and may be in contact with each other.

The second reformed patterns 34 may be formed in the second side surface 54, which is parallel to the second direction Y, and the corner 56. The second reformed patterns 34 may be spaced apart from each other by a distance of about 2 µm or shorter in the second direction Y and may be in contact with each other. In an embodiment, the first reformed pattern 32 and the second reformed pattern 34 may be in contact with each other at the corner 56.

The thin film 10 may be disposed on the substrate W. The thin film 10 may be disposed on the top surface of the substrate W. The thin film 10 may be the remaining portion of the semiconductor device, except for the substrate W. For example, the thin film 10 may include volatile memory devices of a DRAM chip, nonvolatile memory devices of a 3D NAND FLASH memory chip, or semiconductor devices of logic devices.

Figure 17:
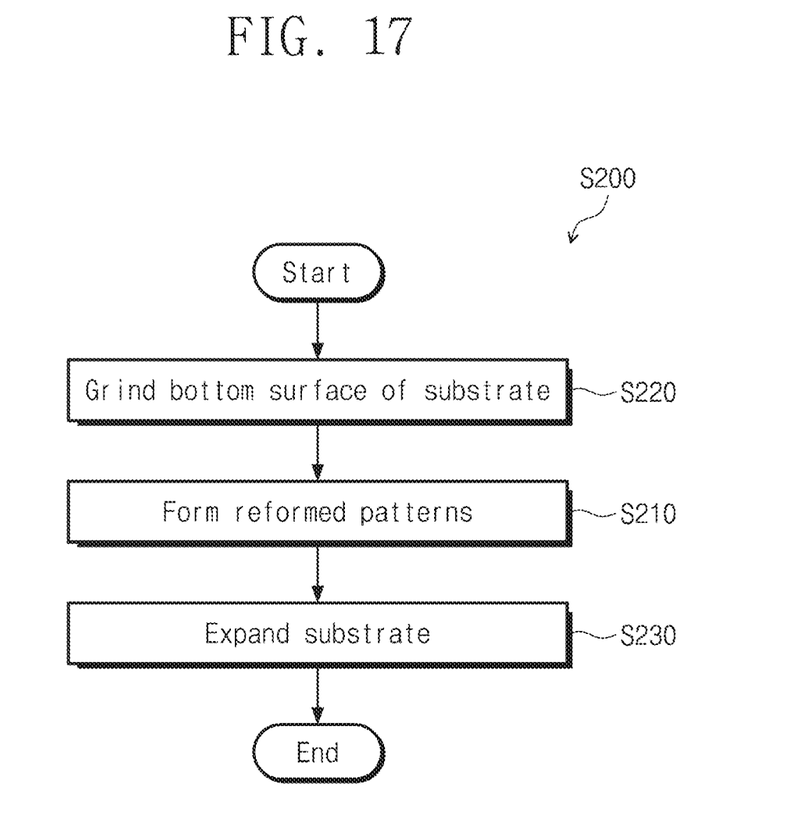
FIG. 17 is a flow chart illustrating an example operation of dicing the substrate of FIG. 1.

FIG. 17 illustrates an example of the operation S200 of dicing the substrate W of FIG. 1.

Referring to FIG. 17, the dicing of the substrate W (in S200) may include grinding the bottom surface of the substrate W (in S220), forming the reformed patterns 30 (in S210), and expanding the substrate W to form the semiconductor chip C (in S230). In an embodiment, the grinding of the bottom surface of the substrate W (in S220) may be performed before the forming of the reformed patterns 30 (in S210). The expanding of the substrate W to form the semiconductor chip C (in S230) may be performed in the same manner as that described with reference to FIG. 3.

According to an embodiment of inventive concepts, a substrate dicing method may include regularly forming reformed patterns in a corner of an active region using an edge focused beam, which is provided to a region crossing the reformed pattern, and this make it possible to limit and/or prevent a dicing crack failure.

While example embodiments of inventive concepts have been particularly shown and described, it will be understood by one of ordinary skill in the art that variations in form and detail may be made therein without departing from the spirit and scope of the attached claims.

What is claimed is:

1. A substrate dicing method, comprising:
   forming reformed patterns in a substrate using a laser beam, the forming the reformed patterns including:
   forming first reformed patterns at a first depth in the substrate by discontinuously providing the substrate with a center focused beam in a first direction; and
   forming second reformed patterns at a second depth equal to the first depth by discontinuously providing the substrate with an edge focused beam in a second direction intersecting the first direction,
   wherein the second reformed patterns are in contact with the first reformed patterns at an intersecting point of the first and second directions and are bigger than the first reformed patterns;
   grinding a bottom surface of the substrate to thin the substrate; and
   expanding the substrate to divide the substrate into a plurality of dies.

2. The method of claim 1, wherein the edge focused beam is produced by a plurality of axicon lenses.

3. The method of claim 2, wherein
   the forming reformed patterns includes focusing the edge focused beam on a position in the substrate using an objective lens, and
   the plurality of axicon lenses include a first axicon lens and a second axicon lens,
   the first axicon lens having a first flat surface and a first inclined surface on the first flat surface,
   the second axicon lens provided between the first axicon lens and the objective lens, and
   the second axicon lens having a second flat surface and a second inclined surface on the second flat surface.

4. The method of claim 3, wherein the first inclined surface and the second inclined surface have an inclination angle of 51.3°.

5. The method of claim 3, wherein the first inclined surface and the second inclined surface face each other.

6. The method of claim 3, wherein the first flat surface is spaced apart from the second inclined surface by a distance of 15 mm.

7. The method of claim 3, wherein the first flat surface and the second flat surface have a diameter of 14 mm.

8. The method of claim 1, wherein
   the forming the first reformed pattern includes forming a plurality of first reformed patterns in a first direction, and
   the forming the second reformed pattern includes forming a plurality of second reformed patterns in a second direction crossing the first direction.

9. The method of claim 1, wherein the reformed patterns are a plurality of regions in the substrate that spaced apart from each other and have a different crystallinity than a bulk region of the substrate.

10. The method of claim 1, wherein the first reformed pattern and the second reformed pattern are formed to have an elongated sphere shape.

11. A substrate dicing method, comprising:
    forming reformed patterns in a substrate using a laser apparatus,
    the laser apparatus including a light source, an objective lens, a first axicon lens, and a second axicon lens,
    the light source configured to generate a laser beam,
    the objective lens between the light source and the substrate,
    the first axicon lens and the second axicon lens between the objective lens and the light source,
    the first axicon lens and the second axicon lens configured to generate an edge focused beam from the laser beam,
    the first axicon lens and the second axicon lens including a first inclined surface and a second inclined surface, respectively, which are inclined at an inclination angle of 51.3° with respect to an optical axis of the laser beam; and
    expanding the substrate to divide the substrate into semiconductor chips.

12. The method of claim 11, wherein
    the first axicon lens and the second axicon lens further include a first flat surface and a second flat surface, respectively, which are on the first inclined surface and the second inclined surface, respectively and
    each of the first flat surface and the second flat surface has a diameter of 14 mm.

13. The method of claim 12, wherein
    the first inclined surface and the second inclined surface face each other, and
    the first flat surface is spaced apart from the second inclined surface by a distance of 15 mm.

14. The method of claim 11, wherein the light source is configured to generate the laser beam to have a pulse frequency of 100 kHz and a wavelength of 1100 nm.

15. The method of claim 11, further comprising:
    grinding the substrate to thin the substrate.

16. A method of fabricating a semiconductor device, comprising:
    forming a thin film on a substrate; and
    dicing the substrate to divide the substrate into a plurality of semiconductor chips,
    the dicing the substrate including forming reformed patterns in a substrate using a laser beam, grinding a bottom surface of the substrate to thin the substrate, and expanding the substrate to divide the substrate into the plurality of semiconductor chips, and wherein the forming the reformed patterns includes:
forming first reformed patterns at a first depth in the substrate by discontinuously providing the substrate with a center focused beam in a first direction; and
forming second reformed patterns at a second depth equal to the first depth by discontinuously providing the substrate with an edge focused beam in a second direction intersecting the first direction,
wherein the second reformed patterns are in contact with the first reformed patterns at an intersecting point of the first and second directions and are bigger than the first reformed patterns.

17. The method of claim 16, wherein
the thin film includes an active region and a non-active region,
the active region is near a center region of the substrate,
the non-active region is in an edge region of the substrate and outside the active region.

18. The method of claim 17, wherein the active region includes a semiconductor device.

19. The method of claim 16, wherein the first reformed pattern is formed by a center focused beam.

20. The method of claim 16, wherein the first reformed pattern and the second reformed pattern are formed to have an elongated sphere shape.

* * * * *